United States Patent [19]

Poon

[11] Patent Number: 5,328,553
[45] Date of Patent: Jul. 12, 1994

[54] METHOD FOR FABRICATING A SEMICONDUCTOR DEVICE HAVING A PLANAR SURFACE

[75] Inventor: Stephen S. Poon, Austin, Tex.

[73] Assignee: Motorola Inc., Schaumburg, Ill.

[21] Appl. No.: 12,177

[22] Filed: Feb. 2, 1993

[51] Int. Cl.$^5$ .......................................... H01L 21/44
[52] U.S. Cl. .................................. 156/636; 437/195; 437/228; 51/218 R; 51/283 R
[58] Field of Search ............... 156/636; 437/195, 228; 51/281 R, 283 R

[56] References Cited

U.S. PATENT DOCUMENTS

| | | | |
|---|---|---|---|
| 4,671,851 | 6/1987 | Beyer et al. | 156/636 |
| 4,789,648 | 12/1988 | Chow et al. | 437/225 |
| 4,944,836 | 7/1990 | Beyer et al. | 156/656 |
| 5,006,484 | 4/1991 | Harada | 437/195 |
| 5,064,683 | 11/1991 | Poon et al. | 427/39 |
| 5,084,416 | 1/1992 | Ozaki et al. | 437/195 |

OTHER PUBLICATIONS

Research Disclosure, Aug. 1992/647, "Planarization of Tungsten Filled Vias with Stringent Topography", Disclosed Anonomously.
W. Patrick et al., "Application of Chemical Mechanical Polishing to the Fabrication of VLSI . . . ", *J. Electrochem. Soc.*, vol. 138, No. 6, Jun. 1991, pp. 1778-1784.
C. Kaanta et al., "Dual Damescene: A ULSI Wiring Technology", VMIC Conference—IEEE, Jun. 11-12, 1991, pp. 144-152.
S. Wolf, *Silicon Processing for the VLSI Era*, vol. 2, Lattice Press, Sunset Beach, CA, 1990, p. 253.

*Primary Examiner*—Brian E. Hearn
*Assistant Examiner*—Laura M. Holtzman
*Attorney, Agent, or Firm*—Jasper W. Dockrey

[57] ABSTRACT

A planar surface (24) is obtained in a semiconductor device (10) having regions of differing material composition by means of a non-selective planarization process. The non-selective planarization process removes insulating material and conductive material at substantially the same rate. In one embodiment of the invention, stud vias (22) are formed by the removal of portions of a conductive layer (20) overlying the surface of an interlevel dielectric layer (16). Once the conductive layer (20) has been removed, the planarization process is continued and surface portions of the interlevel dielectric layer (16) are also removed. Upon completion of the process a planar surface (24) is formed having regions of conductive material and insulating material.

12 Claims, 2 Drawing Sheets

METHOD FOR FABRICATING A SEMICONDUCTOR DEVICE HAVING A PLANAR SURFACE

RELATED APPLICATION

This is related to commonly assigned U.S. patent application Ser. No. 08/011,919, filed Feb. 1, 1993.

1. Field of the Invention

This invention relates in general to a method for fabricating a semiconductor device, and more particularly to a method for forming a planar surface in a semiconductor device.

2. Background of the Invention

In order to build faster and more complex integrated circuits, semiconductor manufacturers have increased the number of components in the integrated circuit while reducing the overall size of the circuit. The reduced circuit size requires multiple overlying conductive layers to electrically interconnect the vast number of components within the integrated circuit. As successive layers of conductors and dielectric materials are deposited over previously defined structures, the surface topography can become uneven. To be manufactured reliably, the conductive layers, which form interconnects, need to be deposited and patterned on a smooth, planar surface. A planarization process may be performed after the deposition of a dielectric layer to reduce the topographic contrast of the dielectric layer. A conductive layer is the deposited on a smooth, even surface and the conductive layer is reliably patterned using conventional photolithography to form interconnects. During the planarization process, electrical conduits known in the art as stud vias can be formed. The stud vias provide a means for electrically connecting the patterned conductive layers on different levels.

A process for the formation of a stud via in accordance with the prior art is shown in FIGS. 1—1 and 1-2. Referring to FIG. 1—1, a conductive lead 13 and a first planar insulation layer 15 overlie a glass layer 11. A second planar insulation layer 17, in which an opening is formed exposing a portion of the lead 13, overlies the first planar insulation layer 15. An etch stop layer 19 overlies the second insulation layer 17, and a third planar insulation layer 21 is formed over the etch stop layer 19.

Planar layers 15, 17, and 21 are each formed by depositing an insulating material, such as silicon dioxide, or a doped silicate glass. Then, the insulating material is either planarized by a polish planarization process, or alternatively, etched back by a plasma etching process. Once a smooth surface is obtained, the next layer is deposited, and the planarization process is repeated. The openings in insulating layers 17 and 21 are formed by applying a photoresist pattern to the surface of the insulating layer, then performing a plasma etching process. The etch stop layer 19 prevents the plasma etching process used to form the opening in insulating layer 21 from etching away the underlying exposed portions of insulation layer 17.

After the insulating layers are prepared, a thick layer of metal 23 is deposited to overlie the surface of the third planar layer 21. The metal fills the openings in layers 21 and 17 and contacts the surface of the lead 13. As illustrated in FIG. 1-2, once the metal is deposited, a selective, chemical-mechanical, polish planarization process is used to planarize the metal and form a smooth surface 27. The planarization process is selective to the particular metal used to form metal layer 23 and does not remove the insulating material of layer 21. After the selective planarization process is complete, a metal stud via 25 has been formed. The stud via 25 is used as an electrical conduit through which an overlying metal lead (not shown) can be electrically coupled to lead 13.

While the process illustrated in FIGS. 1—1 and 1-2 provides a planar surface, the conductive material and the insulating material must be separately planarized. The two-step procedure is time consuming and makes processing more difficult. In addition, incomplete removal of the metal layer, prior to beginning the selective planarization of the insulating layer, can result in the formation of a non-planar surface and possibly cause electrical short circuits.

SUMMARY OF THE INVENTION

The present invention includes a method for fabricating a semiconductor device having a planar surface. The method of the invention non-selectively removes material of differing composition at substantially the same rate. A planar surface having portions of varying composition is advantageously obtained in a single processing step. In one embodiment, a substrate is provided having a patterned first conductive layer thereon. An insulating layer is formed to overlie the first conductive layer, and an opening is formed in the insulating layer exposing a portion of the first conductive layer. A second conductive layer is formed on the dielectric layer. The second conductive layer fills the opening. The second conductive layer and a surface portion of the insulating layer are simultaneously removed to form a planar surface.

BRIEF DESCRIPTION OF THE DRAWINGS

FIGS. 2, 3 and 4, illustrate, in cross-section, process steps in accordance with one embodiment of the invention.

Figure 1:
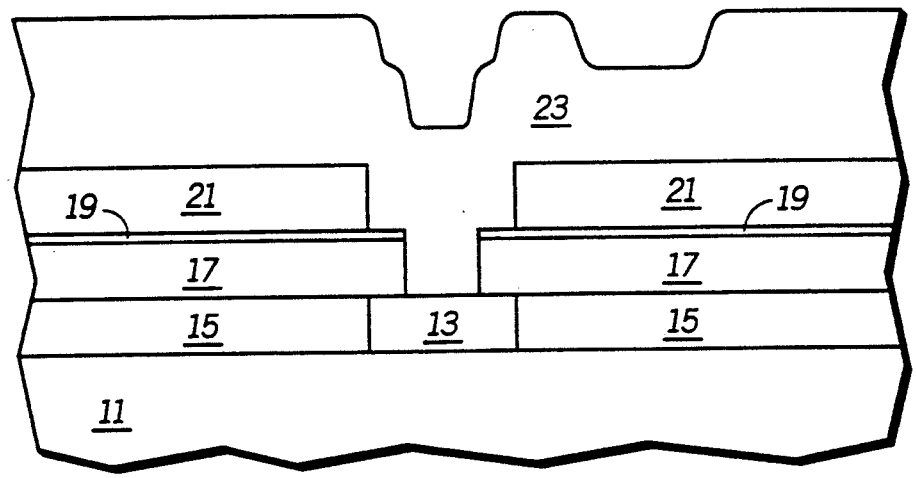
FIGS. 1—1 and 1-2, illustrate, in cross-section, one example of a process for the formation of stud vias according to the prior art.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a process in which overlying layers of different material composition can be planarized in a single processing step. The single-step planarization process improves process efficiency by avoiding the necessity of carrying out an individual planarization process for each material type. By removing the different materials during the same processing step, a planar surface is obtained which is substantially free of defects caused by residual material. The inventive process also advantageously provides a method for forming via interconnect structures in the same processing step in which an interlevel dielectric layer is planarized.

Figures 1, 2:
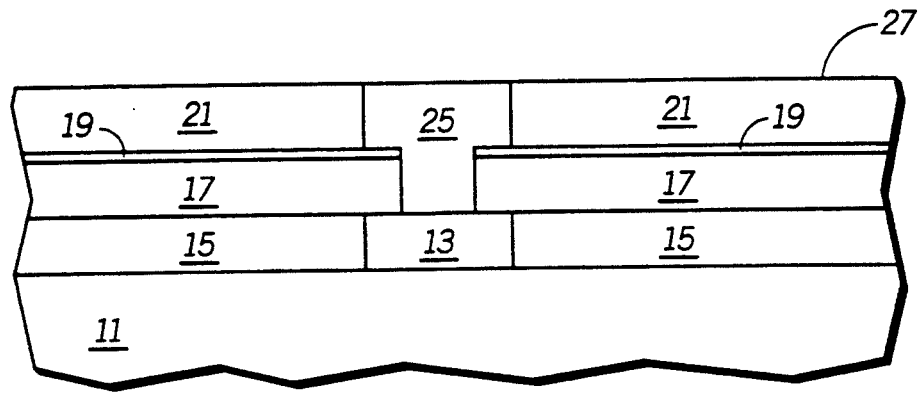
Figure 2:
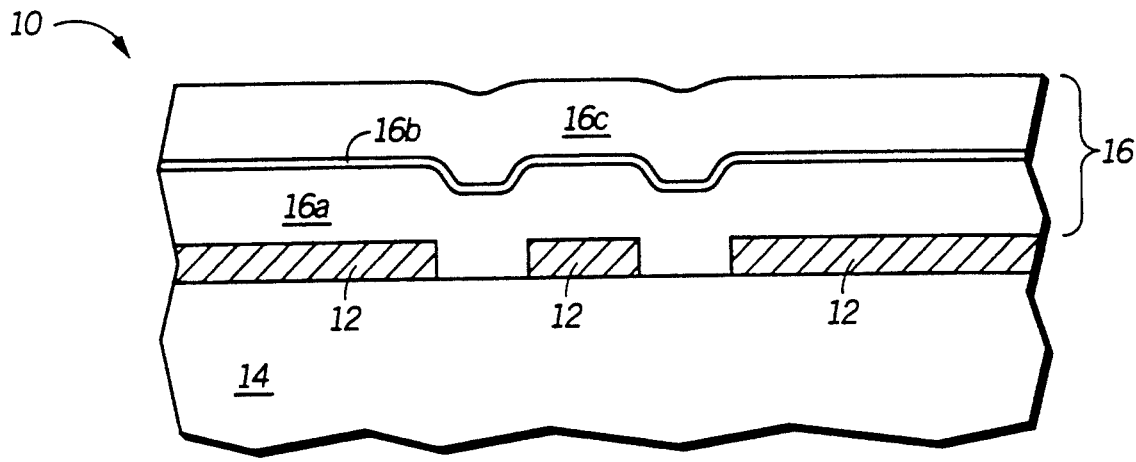

Shown in FIG. 2 is a portion of a semiconductor device 10 having already undergone process steps in accordance with the invention. Conductive leads 12 overlie a planar insulating layer 14. Insulation layer 14 is formed by depositing an insulating material, such as boron phosphorus silicate glass (BPSG), phosphorus silicate glass (PSG), and spin-on-glass (SOG), and the like. In the embodiment illustrated in FIG. 2, the formation of insulation layer 14 takes place after many integrated circuit components, such as transistors and resistors, have been previously formed on the surface of a semiconductor substrate (not shown). Following deposition, the insulating material completely covers the underlying integrated circuit components. The insulating material is then planarized using a conventional chemical-mechanical polishing process, or alternatively, a conventional plasma etch planarization process.

Once insulation layer 14 is planarized, a layer of conductive material is deposited and patterned to form conductive leads 12. The conductive material can be any conductive metal or metal alloy commonly used in semiconductor processing. For example, the conductive material can be aluminum, silicon aluminum, copper, copper silicon aluminum, and the like. In addition, the conductive material can be aluminum covered with an electrically conductive diffusion barrier, such as titanium nitride, and titanium tungsten and the like. Alternatively, the conductive material can be a semiconductor material, such as heavily-doped polysilicon, or a polysilicon-refractory metal compound, such as titanium silicide and the like.

After the conductive material is deposited, a photolithographic pattern is formed, and the material is etched to form conductive leads 12. Following the lead patterning process, an interlevel dielectric layer 16 (ILD) is formed over leads 12. Interlevel dielectric (ILD) layer 16 can be a composite structure including a dielectric material having a polish-stop layer disposed within the dielectric layer, or alternatively, ILD layer 16 can be a monolithic dielectric material. In a preferred embodiment, ILD layer 16 is formed by depositing a first portion 16a over leads 12 and the surface of insulation layer 14. Then, a polish-stop layer 16b is formed on first ILD portion 16a, and a second portion 16c is formed on polish-stop layer 16b. First and second ILD portions 16a and 16c are preferably silicon oxide formed by a chemical vapor deposition process using tetraethylorthosilicate (TEOS). Alternatively, first and second ILD portions 16a and 16c can be a silicate glass, such as BPSG, PSG, SOG, and the like. Polish-stop layer 16b is preferably boron oxynitride (BNO) deposited by chemical vapor deposition. Alternatively, polish-stop layer 16b can be alumina ($Al_2O_3$), silicon nitride ($Si_3N_4$), and the like.

After forming ILD layer 16, via openings 18 are formed in dielectric layers 16 to expose surface portions of leads 12. Via openings 18 are preferably formed by a photolithographic patterning and reactive ion etching process. The reactive ion etch process is a highly directional etch and forms via openings having nearly vertical walls. After the reactive ion etch is complete, an optional, second etch process can be used to widen the openings at the upper surface of ILD layer 16. The second etch process can be a wet etch process, or alternatively, a dry isotropic etching process.

Once via openings 18 are formed, a conductive layer 20 is formed overlying ILD layer 16 and completely filling openings 18. Conductive layer 20 can be formed by either sputter deposition or chemical vapor deposition. In one embodiment, conductive layer 20 is tungsten metal formed by either a selective chemical vapor deposition process, or a conventional chemical vapor deposition process. In the case of selective tungsten deposition, the surface of leads 12 exposed by vias 18 acts as a nucleation site upon which tungsten atoms bond. Subsequent layers of tungsten are successively formed over the first layer until via openings 18 are filled. If the process is continued, the tungsten continues to form until the entire surface of ILD layer 16 is covered. The selective deposition process is initiated by selecting source gases and pressure conditions which enhance the formation of tungsten on the surface of leads 12, while suppressing the formation of tungsten on the surface of dielectric materials, such as ILD layer 16. In an alternative process, a blanket tungsten layer can be formed by a conventional chemical vapor deposition process. In an alternative method, conductive layer 20 can formed by the chemical vapor deposition or sputter deposition of aluminum, copper, a refractory metal silicide, or any of the conductive materials used to form leads 12.

Figure 4:
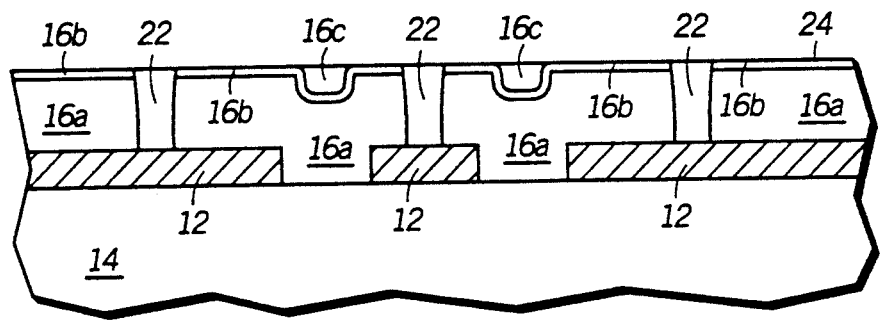

In accordance with one embodiment of the invention, following the formation of conductive layer 20, a non-selective, chemical-mechanical polishing process is carried out to form a planar surface 24, as illustrated in FIG. 4. The polishing process removes portions of conductive layer 20 and ILD portion 16c above the surface of polish-stop layer 16b. The planarization process also forms stud vias 22 in addition to planar surface 24. The non-selective polishing process simultaneously removes conductive layer 20 and all of ILD portion 16c overlying polish-stop layer 16b. Both the conductive material of layer 20 and the insulating material of ILD portion 16c are removed at substantially the same rate. Upon completion, the polishing process leaves regions of ILD portion 16a in recessed areas below the most elevated portions of polish stop layer 16b.

Figure 3:
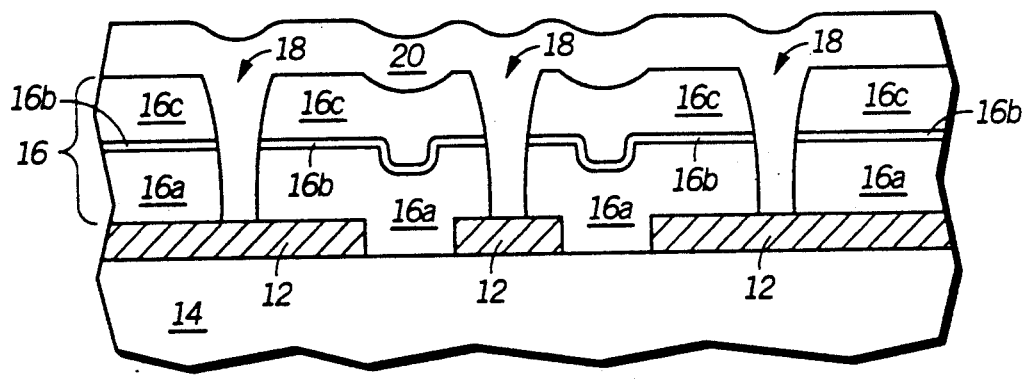

The non-selective polishing process of the invention forms planar surface 24 in a region of differing materials in a single process step. The non-selective polishing process advantageously provides a simplified process for the formation of stud vias 22, as well as other device structures. As previously described, the prior art method for forming stud vias uses a two-step process in which a conductive material and an insulating material are each planarized in separate processing steps. The selective planarization process of the prior art necessarily must include the separate deposition and planarization of an insulating layer prior to the deposition of a conductive layer. In contrast, the non-selective planarization process of the invention enables the formation of a planar surface even where a conductive layer is deposited over a non-planar insulation layer, such as ILD layer 16 shown in FIG. 3.

Preferably, the non-selective polishing process is performed using a slurry, which includes aluminum nitride (AIN), alumina ($Al_2O_3$) particles, and silica particles suspended in deionized water. Alternatively, a non-selective slurry composition includes $Al_2O_3$ and colloidal silica suspended in potassium hydroxide (KOH) can be used. The non-selective slurry can further include a conventional KOH based slurry to which a quantity of silica particles is added. The polishing operation is preferably carried out in a polishing apparatus having a rotating polish wheel and a polyurethane polishing pad disposed thereon. One such commercially available polishing apparatus is the "Westech 372-M" manufactured by Westech Inc. of Phoenix, Ariz. The slurry is applied to the polishing pad, and conductive layer 20 is polished until ILD portion 16c of ILD layer 16 is reached. The polishing process is then continued until polish-stop layer 16b is exposed. Upon completion of the process, planar surface 24 includes portions of conductive layer 20 and ILD layer 16.

In an alternative embodiment, the planarization process can be carried out by another non-selective process in which layers of conductive material and insulating material are removed at substantially the same rate. For example, a high energy ion bombardment process can be used in which a noble gas ions, such as argon, xenon, and the like, impact the surface and sputter away surface atoms. Typically, a high energy planarization process is performed by depositing a thick layer of planarizing material, such as polyimide, to form a flat surface. Then, the flat surface is bombarded with high energy atoms and ions to evenly remove the surface layers. The high energy ion bombardment processes can include ion milling, focused ion beam etching, sputter etching, and the like.

Figure 5:
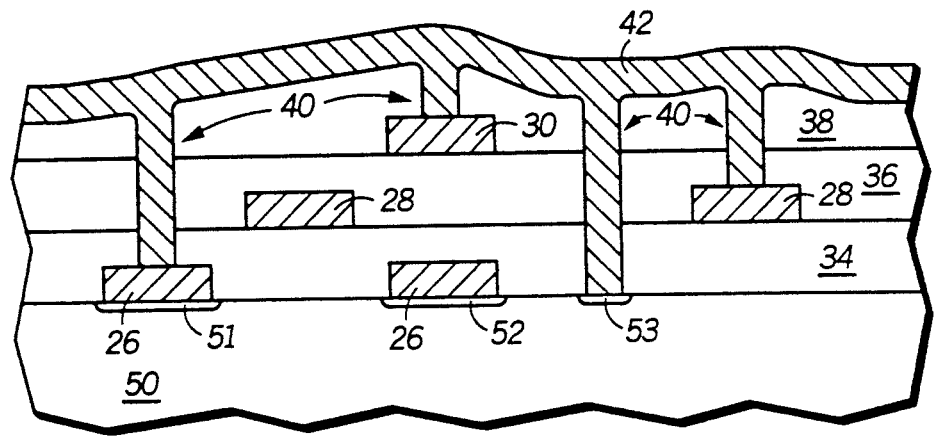
FIGS. 5 and 6, illustrate, in cross-section, process steps in accordance with a further embodiment of the invention.

In a further aspect of the invention, the process of deposition and non-selective planarization can be continued to form successive levels of patterned interconnects. Shown in FIG. 5 is a multi-level interconnect structure in which three different levels of conductive leads 26, 28, and 30 are separated by ILD layers 34 and 36. FIG. 5 includes a semiconductor substrate 50 with doped regions 51, 52, and 53 at the primary surface of the substrate 50. The doped regions may be part of a source region, a drain region, a collector region, a base region, an emitter region, a terminal of a resistor or capacitor, or a contact to a well region or the substrate. The conductive and insulating materials include the same materials previously described in reference to FIG. 3. Preferably, ILD layer 34 is deposited over leads 26, and leads 28 are formed by depositing and patterning a conductive layer on the surface of ILD layer 34. Then, the process is repeated for the formation of ILD layer 36 and leads 30.

In an alternate method, once ILD layer 34 is deposited, via openings 40 are formed. A layer of metal is deposited into the vias and the metal layer and the ILD layer are planarized by the non-selective planarization process of the invention similar to the one described above. In this manner, via studs in ILD layer 34 are formed during the planarization of ILD layer 34. This process is repeated for ILD layer 36. While involving more complex processing, the sequential deposition and planarization method provides a smooth, planar surface upon formation of each ILD layer. The individual planarization of each ILD layer makes the overall surface topography less rough, which enables improved photolithographic definition of the conductive lead patterns.

Following formation of the ILD layers by either of the foregoing processes, a planarizing layer 38 is deposited to overlie lead 30 and ILD layer 36. Planarizing layer 38 can be the same dielectric material as used to form ILD portions 16a and 16c, such as BPSG, PSG, and SOG. Alternatively, planarizing layer 38 can be a silicon nitride ($Si_3N_4$) passivation layer formed by plasma-enhanced chemical vapor deposition (PECVD). In yet another alternative, planarizing layer 38 can be a composite ILD layer, which includes an interposed polish-stop layer similar to ILD layer 16. Once planar layer 38 is formed, via openings 40 are formed in planarizing layer 38. Depending on which of the foregoing methods is used, via openings can also be formed in ILD layers 34 and 36 at this stage of the process. Via openings 40 extend from the surface of planarization layer 38 to the surface of conductive leads 26, 28, and 30. A metal layer 42 is deposited overlying the surface of planarizing layer 38 and within via openings 40. Metal layer 42 can be tungsten, copper, aluminum, or aluminum alloyed with silicon, copper, or both.

Figure 6:
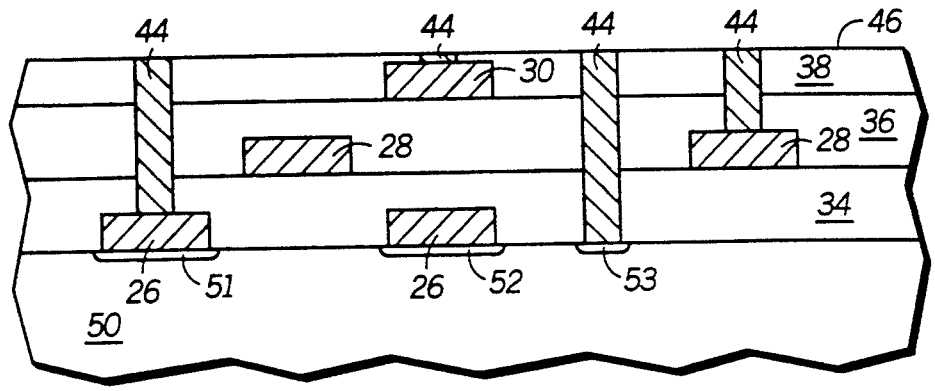

After metal layer 42 is formed a non-selective polish planarization process is carried out to form stud vias 44 and a planar surface 46, as illustrated in FIG. 6. In the absence of a polish-stop layer, the non-selective planarization process is then carried out for a predetermined period of time until the desired amount of material has been removed. When a polish-stop layer is present, the polishing operation is performed in the same manner as described in reference to FIG. 4. In another embodiment, one of the via studs 44 may directly contact the substrate 50, which forms a Schottky diode.

Thus it is apparent that there has been provided, in accordance with the invention, a method for fabricating a semiconductor device having a planar surface which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different types of etching methods can be used to form the via openings including electron cyclotron resonance etching and the like. It is therefore intended to include within the invention all such variations and modifications as fall within the scope of the appended claims and equivalents thereof.

I claim:

1. A method for fabricating a semiconductor device comprising the steps of:

providing a substrate having a patterned first conductive layer thereon;

forming an insulating layer overlying the first conductive layer;

forming an opening in the insulating layer exposing a portion of the first conductive layer;

forming a second conductive layer overlying the insulating layer and within the opening; and simultaneously removing the second conductive layer that lies over the insulating layer and removing a surface portion of the insulating layer to form a planar surface, wherein the step of simultaneous removal is performed such that the removal rates of the second conductive layer and the insulating layer are substantially the same, and wherein the step of simultaneous removal is carried out by chemical-mechanical polishing using a non-selective slurry comprising aluminum nitride and alumina particles suspended in deionized water.

2. The method of claim 1, wherein the step of forming the insulating layer comprises depositing an insulating material selected from a group consisting of silicate glass, phosphorus silicate glass, boron phosphorus silicate glass, spin-on glass, and silicon nitride.

3. The method of claim 1, wherein the step of forming the second conductive layer comprises depositing a refractory metal.

4. The method of claim 1, wherein the step of forming the second conductive layer comprises depositing a metal selected from a group consisting of aluminum, an aluminum silicon alloy, an alloy of copper aluminum silicon alloy, and copper.

5. The method of claim 1, wherein the step of forming the second conductive layer comprises depositing a polysilicon layer that is doped with a dopant selected from a group consisting of phosphorus, arsenic, and boron.

6. The method of claim 1, wherein the step of forming the second conductive layer comprises selectively depositing tungsten.

7. A method for fabricating a semiconductor device comprising the steps of:
providing a substrate having patterned first and second conductive layers formed sequentially over the substrate, wherein the first and second conductive layers are separated by an interlevel dielectric layer and the second conductive layer lies over the interlevel dielectric layer;
forming a planarizing layer overlying the second conductive layer;
forming openings in the planarizing layer and the interlevel dielectric layer exposing a portion of the second conductive layer and a portion of the first conductive layer;
forming a metal layer overlying the planarizing layer and within the openings;
selectively removing a first surface portion of the metal layer; and
simultaneously removing a second surface portion of the metal layer and a surface portion of the planarizing layer to form a planar surface,
wherein the simultaneous removal is carried out by chemical-mechanical polishing using a non-selective slurry comprising aluminum nitride and alumina particles suspended in deionized water.

8. The method of claim 7, wherein the step of forming the metal layer comprises depositing a metal selected from a group consisting of tungsten, aluminum, an aluminum silicon alloy, a copper aluminum silicon alloy, and copper.

9. A method for fabricating a semiconductor device comprising the steps of:
providing a substrate having a patterned first conductive layer thereon;
forming an insulating layer overlying the first conductive layer;
forming an opening in the insulating layer exposing a portion of the first conductive layer;
forming a second conductive layer on the insulating layer and within the opening;
placing the substrate in a polishing apparatus having a non-selective, water-based slurry containing aluminum nitride, alumina, and silica; and
polishing the second conductive layer and a surface portion of the insulating layer to form a planar surface, wherein the polishing removes the conductive layer and the insulating layer at substantially the same rate.

10. The method of claim 9, wherein the second conductive layer is tungsten.

11. The method of claim 9, wherein the step of forming the insulating layer comprises:
forming a first dielectric layer overlying the first conductive layer;
forming a polish-stop layer overlying the first dielectric layer, the polish-stop layer being selected from a group consisting of boron oxynitride and alumina; and
forming a second dielectric layer overlying the polish-stop layer.

12. The method of claim 11, wherein each of the steps of forming the first and second dielectric layers comprises depositing a material selected from a group consisting of silicon oxide, boron phosphorus silicate glass, and phosphorus silicate glass.

* * * * *